United States Patent [19]
Hodama

[11] 4,037,116
[45] July 19, 1977

[54] UP/DOWN SWITCH AND SWITCHING SIGNAL GENERATOR

[75] Inventor: Takuo Hodama, Watsonville, Calif.

[73] Assignee: SBE Incorporated, Watsonville, Calif.

[21] Appl. No.: 715,130

[22] Filed: Aug. 16, 1976

[51] Int. Cl.[2] ....................... H03K 17/18; H01H 19/58

[52] U.S. Cl. ................................ 307/247 A; 307/242; 328/87; 328/110; 328/133; 200/11 DA

[58] Field of Search ......................... 328/87, 133, 110; 307/247 A, 222 R, 242; 200/11 DA

[56] References Cited

U.S. PATENT DOCUMENTS

| | | | |
|---|---|---|---|
| 2,518,324 | 8/1950 | Hurley | 328/87 |
| 3,430,148 | 2/1969 | Miki | 328/133 |
| 3,588,710 | 6/1971 | Masters | 328/133 |
| 4,005,316 | 1/1977 | Tomlinson | 307/247 A |

*Primary Examiner*—John S. Heyman
*Attorney, Agent, or Firm*—Flehr, Hohbach, Test, Albritton & Herbert

[57] ABSTRACT

A rotary switch is provided having a manually engageable control to which is attached an arm carrying a number of switch contact fingers for rotational motion with the control. A printed circuit board has concentric circular arrays of contact pads each of which are contacted by one of the finger contacts on the rotating arm. The outer array of contact pads are connected together and are located in a position counterclockwise from the center array of contact pads which are also connected together. The inner array of contact pads are also connected together and are located in a position clockwise from the array of center contact pads. An innermost continuous contact strip is provided for contact by one of the contact fingers. The contact fingers are electrically common and provide a repeated contact sequence for outer, center and inner contact pad sliding connections for a clockwise rotation of the manual control. The repeated sequence for counterclockwise rotation of the manual control is center, outer and inner contact pad sliding connection. A pair of latches are provided which are set when the contact fingers slide over the center and outer contact pads. The first latch set enables one gate and disables another gate. The second latch set triggers the one gate to provide an output therefrom indicative of the direction of rotation of the manual control. Continued rotation of the manual control in either direction resets both latches, thus repeated signals are provided for continuous turning of the manual control which are indicative of the direction of turning of the control and which may be used to provide an unlimited number of switching signals in either rotary direction. Means may be included for providing a detent for the manual control at each reset position to provide standard rotary switch feel.

10 Claims, 5 Drawing Figures

UP/DOWN SWITCH AND SWITCHING SIGNAL GENERATOR

BACKGROUND OF THE INVENTION

This invention relates to a manually operated switch having an electronically conditioned output, and more particularly to such a switch providing a switch output indicative of the direction of switch actuation.

A switch having a high number of discrete switch positions may be provided having a linear excursion, but switching positions in either direction will be limited by the linear excursion distance available. Rotary switches are preferable due to the small switch volume and the small panel face area required for mounting. When a high number of rotary switch positions are required, such as 45 or more for channel selection for the recent FCC channel expansion assigned to Citizens Band Radio, a purely mechanical switch moves over such a miniscule arc of rotation as to make it difficult to stop the switch in single steps even when positive detents are provided for the switch. Moreover, the rotary switch having detents between switching positions is most familiar with users.

There is a need therefore, for a rotary switch with any convenient number of detents to provide easy manipulation and familiar feel which provides an output dependent upon the rotational direction through which the switch control is moved.

SUMMARY AND OBJECTS OF THE INVENTION

A combination of a mechanical switch and an electronic switch output conditioner gives an indication of switching through a sequence in one direction or the other. The combination includes a switch actuating member which is manually engaged and which has a number of switch contacts mounted thereon for movement therewith. A number of matching switch contact patterns are disposed for sliding electrical contact with ones of the movable switch contacts in either a first or a second predetermined sequence depending on whether the switch is moved in either a first or a second opposing direction respectively. The first predetermined sequence includes a first direction advance signal, a second direction advance signal and a reset signal and the second predetermined sequence includes a second direction advance signal, a first direction advance signal and a reset signal. First and second latches are coupled to receive the first and second predetermined sequences of signals and to provide first and second latch outputs responsive thereto. First and second gates are coupled to receive the latch outputs and to provide a first gate output for the first switching sequence and a second gate output for the second switching signal sequence. The first and second latches are reset after each excursion in either direction between reset positions. A mechanical detent may be provided for the switch in each reset position.

In general, it is an objtect of the present invention to provide a switch containing its own interface with an up/down counter.

Another object of the present invention is to provide an electromechanical switch producing a switch output dependent upon the direction of switch motion.

Another object of the present invention is to provide an electromechanical rotary switch producing an unlimited number of directional indicative switch outputs for a continuing switch rotation.

Another object of the present invention is to provide a rotary switch of small size having the familiar feel of switch control detent between switching positions.

Another object of the present invention is to provide an electromechanical rotary switch which eliminates the effect of contact bounce.

Additional objects and features of the invention will appear from the following description in which the preferred embodiment has been set forth in detail in conjunction with the accompanying drawings.

DESCRIPTION OF THE PREFERRED EMBODIMENTS

Figure 1:
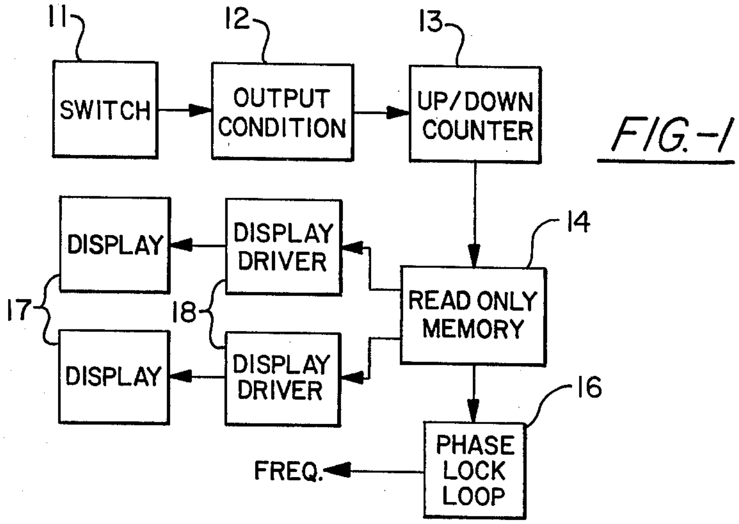
FIG. 1 is a block diagram of the disclosed electromechanical switch used in conjunction with a frequency synthesizer.

The switch disclosed herein will be primarily discussed in terms of a rotary type switch. A linearly acutated switch is also encompassed by the disclosure wherein the respective contact pad patterns would take the form represented at the bottom of FIG. 4. However, the rotary switch is envisioned as being the most useful currently and in the near future. As shown in the block diagram of FIG. 1, a mechanical switch 11 is utilized, which may be of the type currently known including a manually engageable rotational switch actuator and a printed circuit board upon which is mounted particular switch contact patterns which will be hereinafter described. The output of switch 11 is coupled to a switch output conditioning circuit 12 which provides an ouput dependent upon the sense of rotation of the manually engageable switch control. Thus, the switch and output conditioning circuit provides a switch containing its own interface for an up/down counter which may be utilized in a variety of applications. FIG. 1 shows the digital word output from up/down counter 13 coupled to a read only memory 14 which is programmed to provide a further digital word output directed to phase lock loop 16 thereby producing a predetermined output frequency. Read only memory 14, in the block diagram of FIG. 1 also provides output to one or more display drivers 17 which in turn power one or more displays 18. In this fashion, the disclosed switch is utilized as a channel selector for a frequency synthesizer and associated display, where a large number of channel selections are available. As mentioned above the disclosed switch 11 may be in rotary form for use with the newly assigned 45 channels for Citizens Band Radio.

Figure 3A:
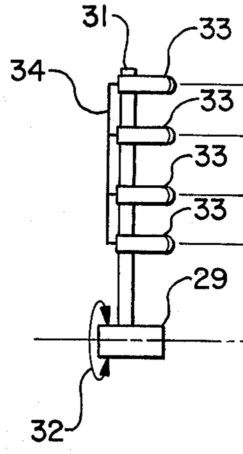
FIG. 3*a* is a side elevational view of the movable contacts in one embodiment of the present invention.
Figure 3:
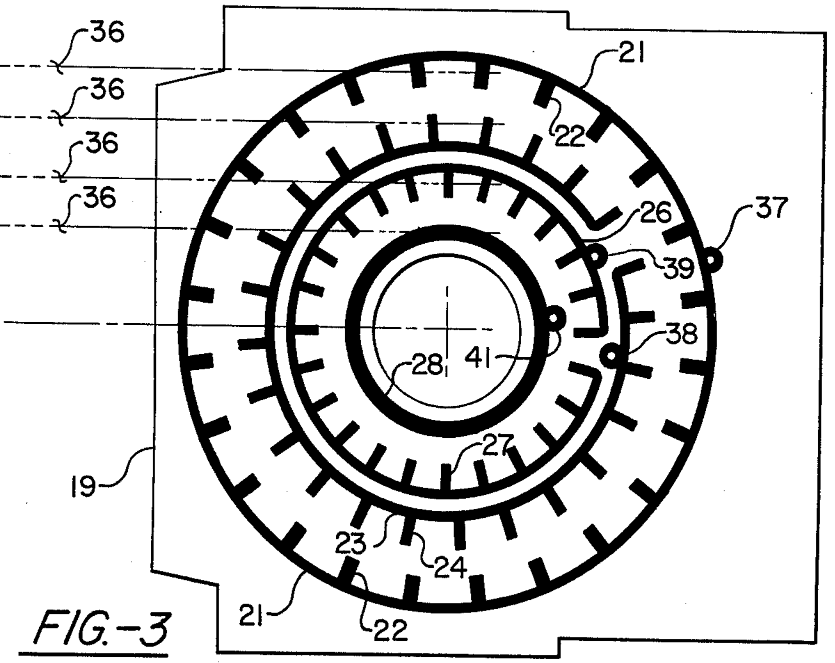
FIG. 3 is a plan view of a printed circuit board for use in the present invention.

FIG. 3 shows a printed circuit board 19 for use in a switch 11 having a plurality of circular switch patterns formed thereon. An outer switch pattern 21 is shown having a plurality of contact pads 22 therein which are electrically connected together. A center switch pattern 23 is shown having a plurality of center contact pads 24 therein which are also electrically connected together. An inner switch pattern 26 is shown also having a plurality of contact pads 27 therein, which, as before, are electrically connected together. An innermost continuous contact strip 28 is provided to serve as a common connection point.

FIG. 3*a* shows a hub 29 having a movable contact arm 31 attached thereto, which may be turned rotationally by means of a manual control (not shown) which is rotatable in either a clockwise or counterclockwise direction as indicated by arrow 32. Movable arm 31 has mounted thereon a number of movable finger contacts 33 which are electrically connected together as seen by common conductor 34. Movable finger contacts 33 are disposed radially on movable contact arm 31 so as to overlie ones of the outer, center, inner and innermost or continuous switch patterns 21, 23, 26 and 28 as indicated by alignment lines 36. Each of the switch patterns 21, 23, 26 and 28 on printed circuit board 19 have associated therewith terminals 37, 38, 39 and 41 for electrical access thereto.

It may be seen in FIG. 3 that contact pads 22 and outer switch pattern 21 occupy an angular position which is clockwise from contact pads 24 and center switch pattern 23. In like manner contact pads 27 and inner switch pattern 26 occupy an angular position which is located clockwise from contact pads 24. Thus, it may also be seen that if hub 29 is located at the center of the concentric set of switch patterns 21, 23, 26 and 28 and movable contact arm is rotated in a clockwise direction, a switching sequence will occur wherein outermost finger contact 33 connects a contact 22 to common contact strip 28, the next contact finger 33 connects one of the contact pads 24 to common contact strip 28, the adjacent contact finger 33 connects one of the contact pads 27 to the continuous contact strip 28. A switch output sequence is therefore provided for clockwise rotation of moving contact arm 31 which consists of an output at terminal 37 followed by an output at terminal 38 followed by an output at terminal 39. It is readily seen that by the same analysis conterclockwise movement of movable contact arm 31 will produce another sequence of switch outputs consisting of a switch output at terminal 38, followed by a switch output at terminal 37, followed by a switch output at terminal 39.

Figure 2:
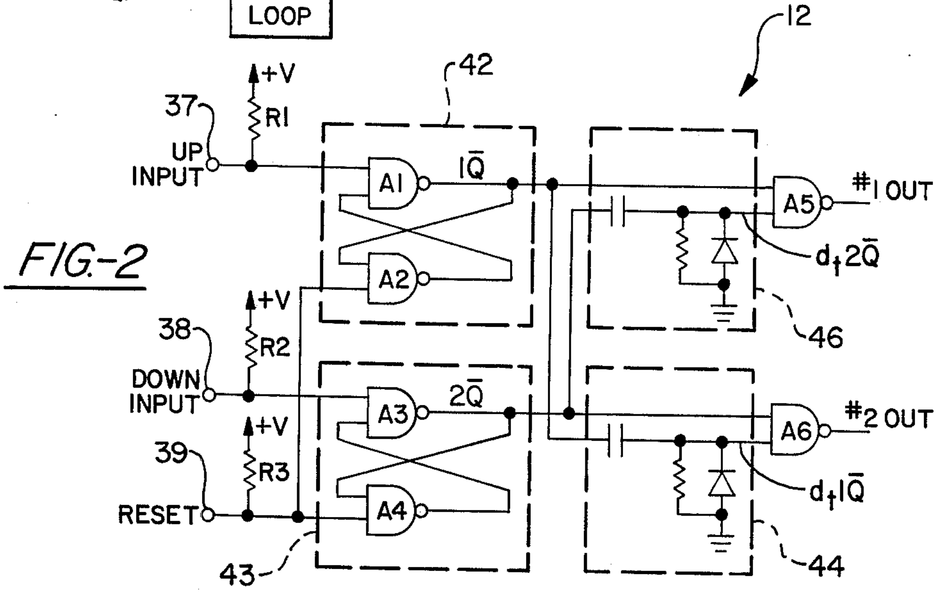
FIG. 2 is an electrical schematic of the disclosed switch signal conditioner circuit.
Figure 4:
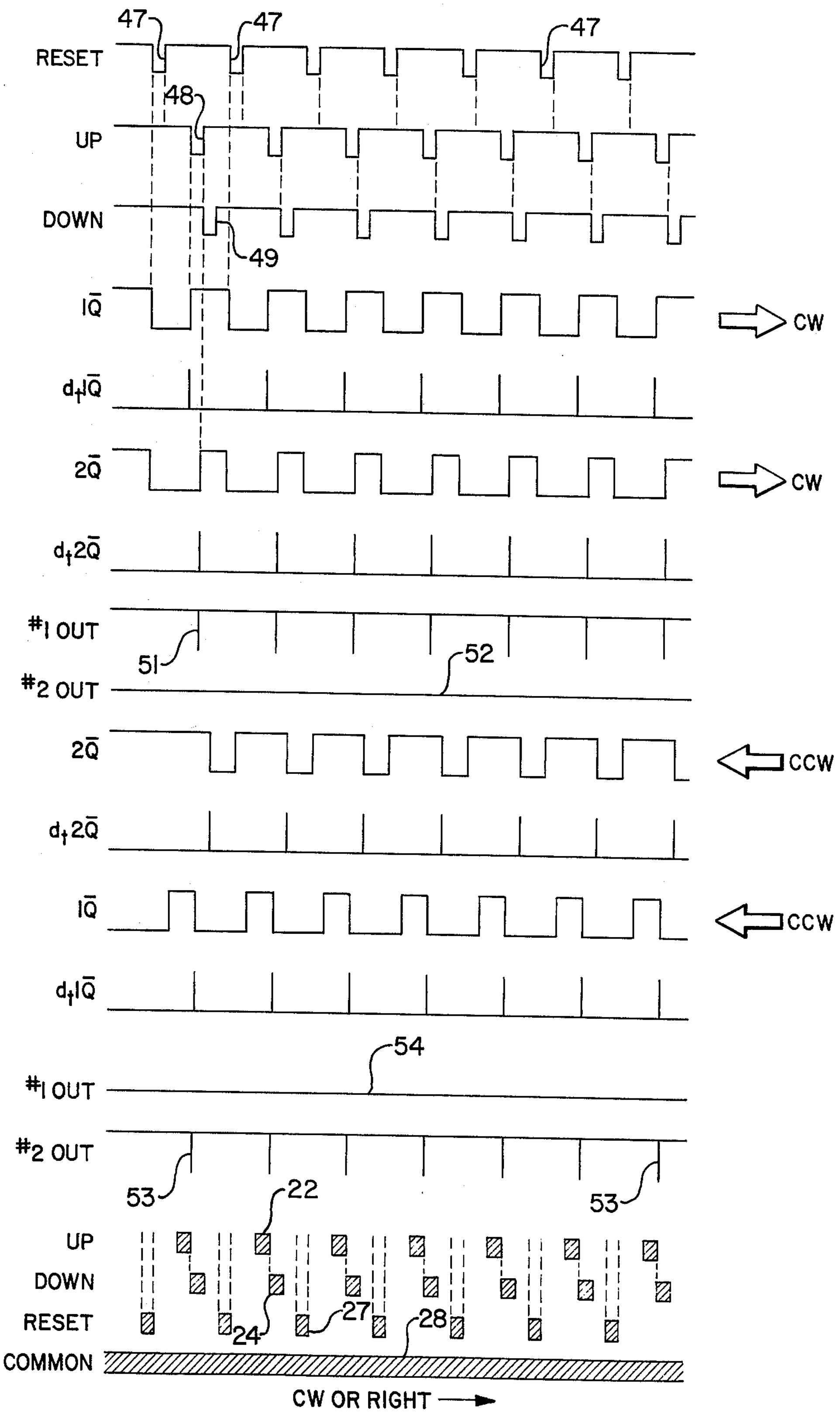
FIG. 4 is a switching sequence diagram showing the signals present in the circuit of FIG. 2.

FIG. 2 shows terminals 37, 38 and 39 at the input to the switch output conditioning circuit 12, which inputs are labeled "up input," "down input" and "reset" respectively. The up input is coupled to one input of a latch 42 containing, in this embodiment, NAND gates A1 and A2. Resistor R1 is coupled to the same input of latch 42 for holding the input in an up state until commanded to a low state by the switch input at terminal 37. The down input at terminal 38 is connected to one input of an additional latch 43 which includes NAND gates A3 and A4. Resistor R2 is also connected to the same input of additional latch 43 serving therefor the same purpose as resistor R1 serves for latch 42. The reset intput at terminal 39 is connected to one input of each of latch 42 and additional latch 43, having resistor R3 connected thereto serving to hold the reset input in an up state until commanded to a low state by the reset input from switch 11. Latch 42 produces an output which is connected to one input of a first gate shown as NAND gate A5 in this embodiment. The output from latch 42 is also connected to differentiating circuit 44 which produces a signal taking the form of the time differential of the output of latch 42 which is in turn connected to one input of a second gate seen in FIG. 2 as NAND gate A6. The output of additional latch 43 is seen connected to the other input of second gate A6 and is also connected to another differentiating circuit 46 for producing a signal proportional to the time differential of the output from additional latch 43 which is connected to the other input of first gate A5. First and second gates A5 and A6 respectively produce outputs indicated as number 1 output and number 2 output, the generation of which will be described hereinafter. Turning now to FIG. 4 the operation of the electromechanical rotary switch described in FIGS. 2 and 3 will be described. A negative going output 47 is seen as the reset pulse which occurs when one of the contact fingers 33 slides over one of the contact pads 27. If hub 29 is being rotated in a clockwise direction as seen in FIG. 3, the next negative going pulse appearing from switch 11 will appear at terminal 37 as the up pulse 48 seen in FIG. 4. If hub 29 is continued to be turned in a clockwise direction the next output from switch 11 will appear at terminal 38 as the down pulse 49 seen in FIG. 4. Continuing to turn hub 29 in a clockwise direction the next pulse appearing from switch 11 will be the second pulse 47 as seen in the uppermost trace of the timing diagram of FIG. 4.

Keeping the sequence for clockwise motion of hub 29 in mind, i.e., "reset," "up," "down" and "reset," it may be seen by reference to FIGS. 2 and 4 that at the time of "up" pulse 48, latch 42 produces an output $1\overline{Q}$ coupled to one input of first gate A5 and simultaneously the time derivative of the output of latch 42 $d_t 1\overline{Q}$ is produced by differentiating circuit 44 and coupled to one input of second gate A6. Upon the occurrence of the down switching pulse 49 from switch 11 additional latch 43 produces an output $2\overline{Q}$ which is coupled to the other input of second gate A6 and simultaneously produces the time derivative of $2\overline{Q}$ through differentiating circuit 46 $d_t 2\overline{Q}$ which is coupled to the other input of first gate A5. Output $1\overline{Q}$ enables first gate A5 and the time derivative of $1\overline{Q}$ disables second gate A6. Therefore output $2\overline{Q}$ provides no output from second gate A6, but the time derivative of output $2\overline{Q}$ triggers first gate A5 to produce a negative going spike seen as number 1 output 51 in FIG. 4, number 2 is seen as an unbroken up state 52 in this embodiment, for this direction of rotation of hub 29 in switch 11.

For counterclockwise rotation of hub 29, the switching signal sequence from switch 11 occurs at terminals 38, 37 and 39 in that order as explained above. This may be seen by referring to the first three traces of FIG. 4 reading from right to left wherein pulse 49 occurs in time sequence before pulse 48 which in turn occurs before reset pulse 47. Dropping down in FIG. 4 to the counterclockwise (CCW) trace for the output of additional latch 43, $2\overline{Q}$, second gate A6 is seen to be enabled thereby and first gate A5 is disabled by the time derivative thereof $d_t 2\overline{Q}$ as produced by differentiating circuit 46. The output of latch 42 for counterclockwise motion of hub 29 is seen to occur later in time than the output $2\overline{Q}$ from additional latch 43 after first gate A5 is disabled. Therefore no output is produced from first gate A5. Concurrent with the leading edge of the output from latch 42 the time derivative of $1\overline{Q}$, $d_t 1\overline{Q}$ is produced by differentiating circuit 44 and connected to the other input of second gate A6 to trigger an output therefrom seen as number 2 output 53. Number 1 output is seen as a continuous up state 54 for this embodiment. Continuing rotation of hub 39 counterclockwise produces a reset pulse 47 when contact finger 33 slides over a contact pad 27 to reset both latch 42 and additional latch 43, thereby returning both $1\overline{Q}$ and $2\overline{Q}$ to their normal low state as seen in FIG. 4 for counterclockwise rotation of hub 29.

Thus, clockwise rotation produces an output sequence from switch 11 of up pulse 48, down pulse 49 and reset pulse 47 and counterclockwise rotation of hub 29 produces from switch 11 a sequence of down pulse 49, up pulse 48 and reset pulse 47. The former sequence latches latch 42 first which enables first gate A5 and disables second gate A6, followed by latching additional latch 42 which produces no output from disabled second gate A6 and triggers first gate A5 through differentiating circuit 46. The latter sequence operates to latch additional latch 43 first, thereby enabling second gate A6 and disabling first gate A5 followed by latching latch 42 which produces an output blocked by disabled first A5 and which triggers second gate A6 through differentiating circuit 44. The diagram of FIG. 4 is not time dependent, but is switch position dependent as seen by reference to the contact pads 22, 24, 27 and continuous contact strip 28. As seen in FIG. 4, a linearly actuated switch could be constructed using the structure disclosed herein, though a rotary switch using the contact patterns of FIG. 3 is probably the more useful of the two. For either a rotary or linear actuated switch 11 means may be included for providing switch detents at each switch position where contact finger 33 overlies a reset contact pad 27. In this fashion, normal feel is provided for switch operators who are used to the linear or rotary switch having a limited number of switch positions for one revolution only.

A switch has been disclosed in its rotary embodiment provides for an unlimited number of switch outputs for a continouous unidirectional rotation. Both embodiments of the disclosed switch eliminate the effect of contact bounce as the switch direction sensitive output is provided by latches which are actuated by the initial switch contact. It is to be understood that different forms of the disclosed logic are encompassed by the novel structure disclosed herein.

What is claimed is:

1. An electromechanical switch for selective switching in first and second opposing directions comprising a switch actuating member for manual engagement, a plurality of switch contacts mounted for movement by said switch actuating member, a plurality of matching switch contacts being disposed for electrical contact with ones of said switch contacts in first and second predetermined sequence in accordance with the first and second opposing direction selection, said matching switch contacts providing a first direction advance signal, a second direction advance signal and a reset signal when in electrical contact with said ones of said switch contacts, first and second latches coupled to receive said first and second direction advance signals respectively and said reset signal, and providing first and second latch outputs responsive thereto, first and second gates coupled to each receive said first and second latch outputs, said first gate providing a first switch output with said second gate being disabled when said first predetermined sequence of switch contact occurs, and said second gate providing a second switch output with said first gate being disabled when said second predetermined sequence of switch contact occurs, said first and second latches being reset by said reset signal.

2. An electromechanical switch as in claim 1 together with first means for coupling said first latch output to said second gate and second means for coupling said second latch output to said first gate, said first and second means for coupling providing a differentiated first and second latch output signal respectively, whereby said later occurring differentiated signal triggers said switch output from said gate to which it is coupled and the level of said earlier occurring differentiated signal disables said switch output from said gate to which it is coupled.

3. An electromechanical switch as in claim 1 together with a rotating arm, said plurality of switch contacts being mounted on said rotating arm, and wherein said plurality of matching switch contacts comprise first, second and third circular contact patterns disposed on a surface for sliding contact with ones of said plurality of switch contacts, whereby clockwise and counterclockwise rotation of said switch actuating member provides said first and second predetermined sequences respectively.

4. A rotary switch for providing an unlimited number of switching steps in either direction, comprising a rotary actuator for manual engagement, a rotating arm attached to said rotary actuator for rotational movement therewith, a plurality of switch contacts mounted on said rotating arm, a plurality of circular switch patterns slidably contacted by ones of said plurality of switch contacts, ones of said plurality of circular switch patterns providing a first signal, a second signal, and a reset signal when contacted by respective switch contacts, first and second latches coupled to receive said first and second signals respectively and said reset signal and to provide first and second latch outputs responsive thereto, first and second gates coupled to receive said first and second latch outputs and to provide an up count signal and a down count signal respectively, said first, second and reset signals occurring repeatedly in one sequence for one direction of rotation of said rotary actuator and in a reverse sequence for the other direction of rotation, said first signal enabling said first gate and triggering said second gate, said second signal enabling said second gate and triggering said first gate, whereby said up count signal is provided for said one direction of rotation and said down count signal is provided for said other direction of rotation and said latches are reset after each up and down count.

5. A rotary switch as in claim 4 together with means for providing a rotational detent for each arc segment of a predetermined magnitude through which said rotary actuator is turned, said rotational detent being aligned rotationally with said circular switch pattern providing said reset signal, whereby one of said up and down count signals is provided for a rotary excursion through each arc segment and said rotary actuator has the feel of a standard rotary detent switch.

6. A rotary switch and signal conditioner comprising a rotary selector, a plurality of contact fingers for movement by said rotary selector, a plurality of concentric switch contact patterns for electrical contact with ones of said contact fingers, said switch contact patterns being arrayed to provide repeated first, second and reset outputs for one direction and second, first and reset outputs for the opposite rotation of said rotary selector, means for receiving said first, second and reset outputs providing a first signal sequence including a first enabling signal and a first triggering signal followed by a second enabling signal and a second triggering signal for said one direction of rotation and providing a second signal sequence including said second enabling signal and said second triggering signal followed by said first enabling signal and said first triggering signal for said opposite direction of rotation, a first gate receiving said first enabling signal and said second triggering signal and a second gate receiving said second enabling signal and said first triggering signal, whereby said first signal sequence provides an output from said first gate indicative of said one direction of rotation and said second signal sequence provides an output from said second gate indicative of said opposite direction of rotation.

7. A rotary switch and signal conditioner as in claim 6 together with means for providing a detent for said rotary selector at each rotational position at which said reset output is provided, whereby the feel of a standard mechanical rotary switch is obtained with an unlimited number of first and second outputs is available for movement of said rotary selector in said one direction and said opposite direction of rotation respectively.

8. A rotary switch signal conditioner as in claim 6 wherein said means for receiving comprises first and second latches coupled to receive said first and second outputs respectively and said reset output, said first latch providing said first enabling signal and said second latch providing said second enabling signal, a first differentiator connected to receive said first enabling signal and providing said first triggering signal and a second differentiator connected to receive said second enabling signal and providing said second triggering signal.

9. A manually operated rotary switch comprising a manually engagable actuator disposed for rotary motion, a rotating arm attached to said actuator, a plurality of moving switch contacts mounted for motion with said rotating arm, a switch plate, first, second and third circular switch pattern arrays on said switch plate each having a plurality of contact pads arranged for contact with ones of said plurality of moving switch contacts, said contact pads in said first circular switch pattern being disposed counterclockwise from said contact pads in said second pattern and said contact pads in said second pattern being disposed counterclockwise from said contact pads in said third circular switch pattern, whereby a repeated contact sequence between first, second and third switch patterns and said plurality of moving switch contacts is obtained with clockwise motion of said manually engageable actuator, first and second latches sequenced to latch due to contact between said moving switch contacts and said contact pads in said first and second circular switch pattern arrays respectively, and sequenced to reset due to contact between said moving switch contacts and said contact pads in said third circular switch pattern array, whereby said first latch is actuated first for clockwise motion of said manually engageable actuator and said second latch is actuated first for counterclockwise rotation thereto, means responsive to the first actuated of said first and second latches providing an up count signal for clockwise rotation of said manually engageable actuator and a down count signal for counterclockwise rotation thereof, whereby an up count signal is provided for each excursion of said moving switch contacts between contact pads in said third circular switch pattern array in a clockwise sense and a down count signal is provided for each like excursion in a counterclockwise sense.

10. A manually operated rotary switch as in claim 9 together with means for providing a detent for said manually engageable actuator rotationally aligned with each of said contact pads in said third circular switch pattern.

* * * * *